United States Patent
Hayakawa

(10) Patent No.: US 6,421,382 B1
(45) Date of Patent: Jul. 16, 2002

(54) PULSE WIDTH MODULATION SIGNAL GENERATOR

(75) Inventor: Kazuyoshi Hayakawa, Tokyo (JP)

(73) Assignee: NEC Corporation, Tokyo (JP)

( * ) Notice: Subject to any disclaimer, the term of this patent is extended or adjusted under 35 U.S.C. 154(b) by 91 days.

(21) Appl. No.: 09/605,384

(22) Filed: Jun. 28, 2000

(30) Foreign Application Priority Data

Jun. 29, 1999 (JP) .......................................... 11-184116

(51) Int. Cl.[7] ................................................ H03K 7/08
(52) U.S. Cl. ........................ 375/238; 332/109; 370/212; 327/172
(58) Field of Search ........................ 375/238; 332/109; 370/212; 327/172, 175

(56) References Cited

U.S. PATENT DOCUMENTS

| | | | | |
|---|---|---|---|---|
| 5,177,373 A | * | 1/1993 | Nakamura | .................. 329/109 |
| 5,298,871 A | * | 3/1994 | Shimohara | .................. 332/109 |
| 5,404,116 A | * | 4/1995 | Ichihara | ...................... 332/109 |
| 5,963,107 A | * | 10/1999 | Nagano et al. | ............. 332/109 |

FOREIGN PATENT DOCUMENTS

| | | |
|---|---|---|
| JP | 10-209829 | 8/1998 |
| JP | 10-268902 | 10/1998 |

* cited by examiner

Primary Examiner—Temesghen Ghebretinsae
(74) Attorney, Agent, or Firm—Sughrue Mion, PLLC

(57) ABSTRACT

A PWM signal generator allowing a desired combination of cycle and duty to be reliably generated from cycle and duty set values received from a CPU is disclosed. A cycle comparator compares a counted value of a timer to a cycle set value and a duty comparator compares the counted value to a duty set value. A PWM output circuit outputs a PWM signal that is set and reset depending on a combination of a cycle coincidence signal and a duty coincidence signal generated from the cycle and duty comparators, respectively. A transfer controller controls transfers timing of cycle and duty set values while monitoring the cycle coincidence signal and the write timing of the cycle and duty set values.

12 Claims, 4 Drawing Sheets

DESIGNED OUTPUT

UNDESIRED OUTPUT

PULSE WIDTH MODULATION SIGNAL GENERATOR

BACKGROUND OF THE INVENTION

1. Field of the Invention

The present invention generally relates to a pulse signal generator, and in particular to an apparatus and method for generating a pulse width modulation (PWM) signal according to given data.

2. Description of the Related Art

In general, a PWM signal generator employs a phase-locked loop circuit that generates a rectangular clock signal from a system clock signal and a PWM controller for producing a PWM signal from the rectangular clock signal and a modulating signal. This type of PWM signal generator is disclosed in, for example, Japanese Patent Application Unexamined Publication No. 10-209829.

As another approach, there has been proposed a PWM generator having a free-run counter, master and slave compare registers, a transfer controller, and an output circuit (Japanese Patent Application Unexamined Publication No. 10-268902). More specifically, the free-run counter generates a overflow signal when its counted value reaches a predetermined value. A microprocessor or CPU writes a set value to the master compare register through a data bus. The transfer controller allows the set value to be transferred from the master compare register to the slave compare register and inhibits the transfer of the set value in response to an the overflow signal. A comparator compares the counted value of the free-run counter and the set value transferred into the slave compare register and generates a coincident signal when the counted value is coincident with the set value. The output circuit generates a PWM signal in response to the overflow signal and the coincident signal.

In the case where both cycle value and duty value of a PWM signal are controlled, however, it is necessary for the CPU to manage the write timing of cycle and duty set values so as to prevent the PWM signal from being generated at undesired timing and in undesired combinations of cycle and duty values. In this case, another counter for controlling the write timing is needed, resulting in increased amount of hardware.

SUMMARY OF THE INVENTION

An object of the present invention is to provide a PWM signal generating apparatus and method allowing designed cycle and duty of a PWM signal to be produced with reliability and without increasing in the amount of hardware.

According to the present invention, an apparatus for generating a pulse width modulation (PWM) signal depending on a sequence of combinations of cycle set value and duty set value which are received from a controller, includes: a first cycle setting memory for storing the cycle set value which is written according to a cycle write control signal; a second cycle setting memory for storing a current cycle set value which is transferred from the first cycle setting memory according to a transfer permit signal; a first duty setting memory for storing the duty set value which is written according to a duty write control signal; a second duty setting memory for storing a current duty set value which is transferred from the first duty setting memory according to the transfer permit signal; a timer for counting according to a predetermined clock signal to produce a counted value; a cycle comparator for comparing the counted value to the current cycle set value to produce a cycle coincidence signal when the counted value reaches the current cycle set value, wherein the cycle coincidence signal causes the timer to be reset to zero; a duty comparator for comparing the counted value to the current duty set value to produce a duty coincidence signal when the counted value reaches the current duty set value; and an output section for setting the PWM signal when the cycle coincidence signal is produced and resetting the PWM signal when the duty coincidence signal is produced.

When at least one of cycle and duty of the PWM signal is changed in a following cycle, at least corresponding one of the cycle write control signal and the duty write control signal may be received from the controller until the cycle coincidence signal is produced.

A transfer controller is preferably provided which produces the transfer permit signal based on the cycle coincidence signal, the cycle write control signal, the duty write control signal, and an operation status of the timer. The transfer controller may produce the transfer permit signal when the cycle coincidence signal is produced in an interval after the duty write control signal has been produced and before the cycle write control signal is produced. In other words, the transfer controller sets a write history flag when the cycle write control signal is produced and resets the write history flag when the duty write control signal is produced, wherein the transfer permit signal is produced when the cycle coincidence signal is produced and the write history flag is in reset status, and the transfer permit signal is not produced when the cycle coincidence signal is produced and the write history flag is in set status.

A transfer controller may be provided which produces the transfer permit signal when a transfer request signal is received from the controller.

According to the present invention, a method for generating a pulse width modulation (PWM) signal depending on a sequence of combinations of cycle set value and duty set value which are received from a controller, includes the steps of: a) storing the cycle set value which is written according to a cycle write control signal, into a first cycle setting memory; b) storing a current cycle set value which is transferred from the first cycle setting memory according to a transfer permit signal, into a second cycle setting memory; c) storing the duty set value which is written according to a duty write control signal, into a first duty setting memory; d) storing a current duty set value which is transferred from the first duty setting memory according to the transfer permit signal, into a second duty setting memory; e) counting according to a predetermined clock signal to produce a counted value; f) comparing the counted value to the current cycle set value to produce a cycle coincidence signal when the counted value reaches the current cycle set value, wherein the cycle coincidence signal causes the counted value to be reset to zero; g) comparing the counted value to the current duty set value to produce a duty coincidence signal when the counted value reaches the current duty set value; and h) setting the PWM signal when the cycle coincidence signal is produced and resetting the PWM signal when the duty coincidence signal is produced.

DETAILED DESCRIPTION OF THE PREFERRED EMBODIMENTS

Figure 1:
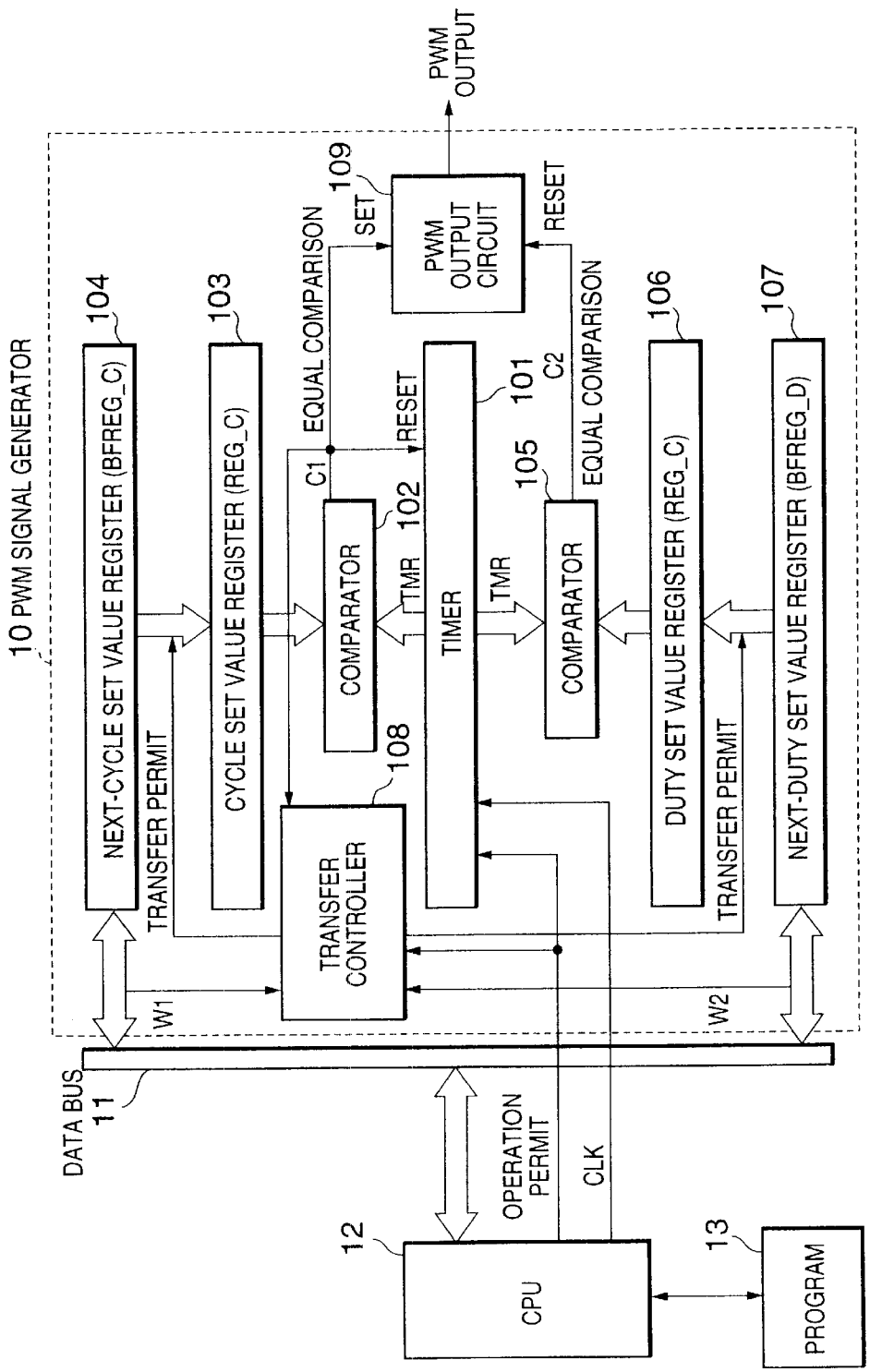
FIG. 1 is a block diagram showing a PWM signal generator according to an embodiment of the present invention.

Referring to FIG. 1, a PWM signal generator 10 is connected to a microprocessor (CPU) 12 through a data bus 11. The CPU 12 performs a PWM signal generating operation by executing a PWM signal generation program that is stored in a memory 13. In this embodiment, the CPU 12 outputs a cycle data and duty data to the PWM signal generator 10 through the data bus 11 and further supplies a clock signal CLK and an operation permit signal to the PWM signal generator 10 as described later.

The PWM signal generator 10 is provided with a timer 101 that performs counting operation according to the clock signal CLK when the operation permit signal is received from the CPU 12. The timer 101 outputs its counted value TMR to comparators 102 and 105.

The comparator 102 compares the counted value TMR and a cycle set value that is written in a cycle set value register (REG_C) 103. When the counted value TMR reaches the cycle set value, the comparator 102 outputs an equal comparison (cycle coincidence) signal C1 to the timer 101, a transfer controller 108, and a PWM output circuit 109. When receiving the equal comparison signal C1 from the comparator 102, the timer 101 is reset to zero.

The cycle set value is transferred from a next-cycle set value register (BFREG_C) 104 to the cycle set value register 103 when receiving a transfer permit signal from the transfer controller 108. A next-cycle set value is written by the CPU 12 into the next-cycle set value register 104 when a write signal W1 is input from the CPU 12.

The comparator 105 compares the counted value TMR and a duty set value that is written in a duty set value register (REG_D) 106. When the counted value TMR reaches the duty set value, the comparator 105 outputs an equal comparison (duty coincidence) signal C2 as a reset signal to the PWM output circuit 109.

The duty set value is transferred from a next-duty set value register (BFREG_D) 107 to the duty set value register 106 when receiving a transfer permit signal from the transfer controller 108. A next-duty set value is written by the CPU 12 into the next-duty set value register 107 when a write signal W2 is input from the CPU 12.

The transfer controller 108 has a write history flag (not shown) therein. As described later, the write history flag is set when the write signal W1 is input and is reset when the write signal W2 is input. The transfer permit signal is output only when the equal comparison signal C1 is input in the case of the write history flag being reset. When the write history flag is in set state, the transfer permit signal is not output even when the equal comparison signal C1 is input.

The PWM output circuit 109 may be a flip-flop circuit. When the equal comparison signal C1 is received as a set signal from the comparator 102, the PWM output circuit 109 is set and causes its output to go high. When the equal comparison signal C2 is received as a reset signal from the comparator 105, the PWM output circuit 109 is reset and causes its output to go low. Therefore, a PWM signal having desired or designed cycle and duty is obtained by a sequence of combinations of cycle set and duty set values that are written in the cycle set value register 103 and the duty set value register 106, respectively.

Next, a PWM signal generating operation according the embodiment of the present invention will be described in detail.

The PWM signal generating operation is performed by the PWM signal generation program running on the CPU 12. It is assumed for simplicity that the CPU 12 determines the cycle and duty of PWM output such that Cycle=Ca and Duty=Da for a first cycle, Cycle=Cb and Duty=Db for a second cycle, and Cycle=Cc and Duty=Dc for a third cycle.

Figure 2:
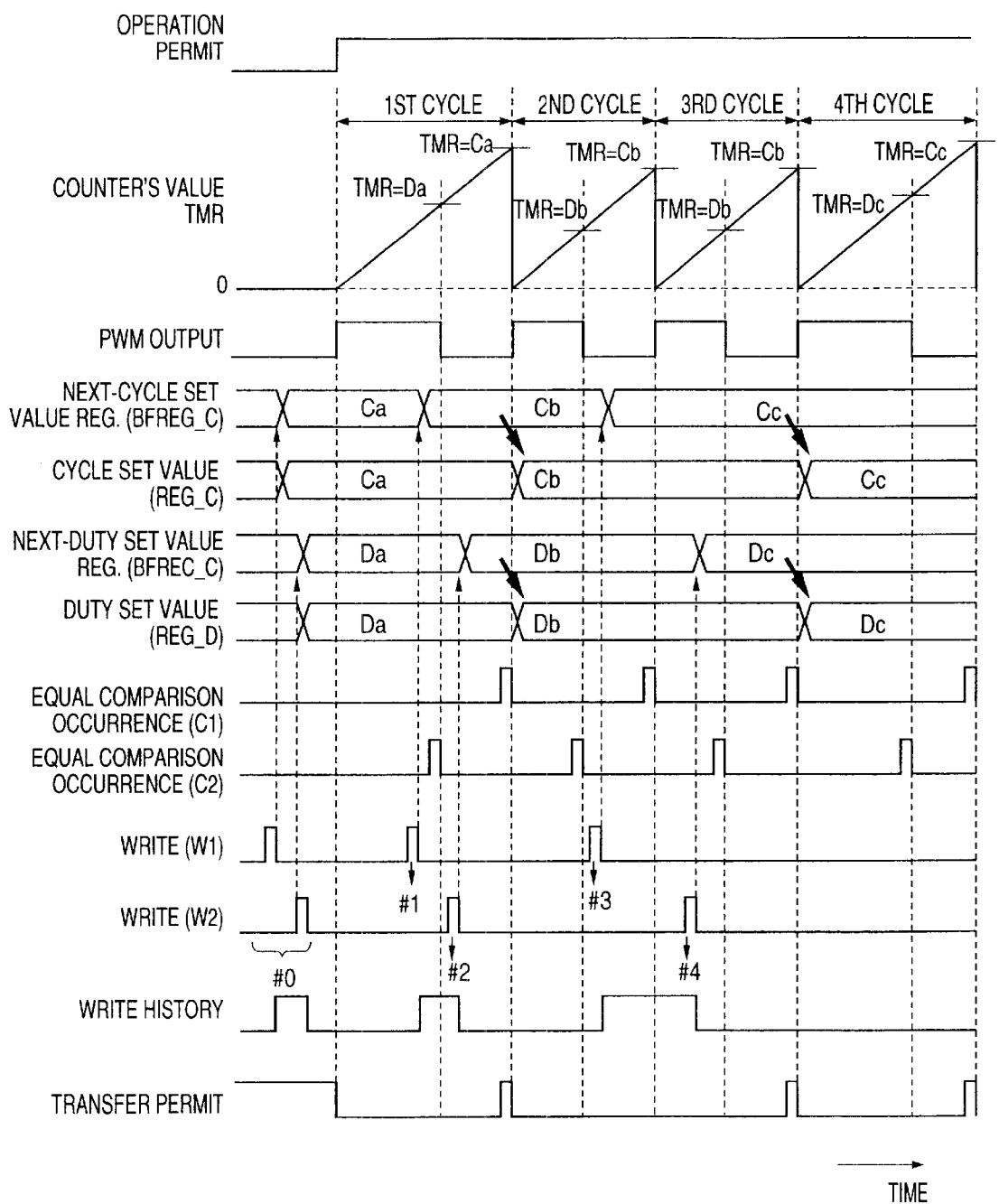
FIG. 2 is a time chart showing a PWM signal generating operation of another embodiment as shown in FIG. 1.

Referring to FIG. 2, the CPU 12 performs write operations #0 before the operation permit signal output to the timer 101 goes high. In this stage, since the timer 101 does not work, the transfer controller 108 causes the transfer permit signal to be set.

More specifically, the CPU 12 writes a cycle set value Ca to the next-cycle set value register 104 through the data bus 11 at the timing of the write signal W1. Since the transfer permit signal is set, the cycle value Ca is transferred from the next-cycle set value register 104 to the cycle set value register 103. At the timing of the trailing edge of the write signal W1, the transfer controller 108 causes the write history flag to be set and be kept at the set status until the trailing-edge of the write signal W2.

On the other hand, the CPU 12 writes a duty set value Da to the next-duty set value register 107 through the data bus 11 at the timing of the write signal W2. Since the transfer permit signal is set, the duty set value Da is transferred from the next-duty set value register 107 to the duty set value register 106. At the timing of the trailing edge of the write signal W2, the transfer controller 108 causes the write history flag to be reset. In this way, the cycle and duty data for the first cycle are stored in the cycle set value register 103 and the duty set value register 106, respectively.

When the operation permit signal goes high, the timer 101 starts counting according to the clock signal CLK and the PWM output circuit 109 causes the PWM output to go high. At the same time, the transfer controller 108 causes the transfer permit signal to be reset.

The CPU 12 performs write operations #1 and #2 before the counted value TMR of the timer 101 reaches the cycle set value Ca stored in the cycle set value register 103. In this stage, since the timer 101 is working, the transfer permit signal is reset. More specifically, the CPU 12 writes a next cycle set value Cb to the next-cycle set value register 104 through the data bus 11 at the timing of the trailing edge of the write signal W1 (write operations #1). Since the transfer permit signal is reset, the cycle set value Cb is not transferred to the cycle set value register 103. At the timing of the trailing edge of the write signal W1, the transfer controller 108 causes the write history flag to be set and be kept at the set status until the trailing-edge of the write signal W2.

On the other hand, the CPU 12 writes a duty set value Db to the next-duty set value register 107 through the data bus 11 at the timing of the trailing edge of the write signal W2 (write operations #2). Since the transfer permit signal is reset, the duty set value Db is not transferred from the next-duty set value register 107 to the duty set value register 106. At the timing of the trailing edge of the write signal W2, the transfer controller 108 causes the write history flag to be reset. In this way, the cycle and duty data for the second cycle are stored in the next-cycle set value register 104 and the next-duty set value register 107, respectively.

When the counted value of the timer 101 reaches the duty set value Da stored in the duty set value register 106, the comparator 105 outputs an equal comparison signal C2 to the reset terminal of the PWM output circuit 109. At the trailing edge of the equal comparison signal C2, the PWM output circuit 109 causes the PWM output to go low. Thereafter, when the counted value of the timer 101 reaches the cycle set value Ca stored in the cycle set value register 103, the comparator 102 outputs an equal comparison signal C1 to the timer 101, the transfer controller 108, and the PWM output circuit 109. At the trailing edge of the equal comparison signal C1, the timer 101 is reset to zero and then is started counting again and the PWM output of the PWM output circuit 109 goes high. At the same time, the transfer controller 108 outputs the transfer permit signal, so that the next cycle set value is transferred from the next-cycle set value register 104 to the cycle set value register 103 and the next duty set value is transferred from the next-duty set value register 107 to the duty set value register 106. In this way, the second cycle is started.

The timer 101 and the comparators 102 and 105 operate in the same manner as in the first cycle. That is, when the counted value of the timer 101 reaches the duty set value Db stored in the duty set value register 106, the comparator 105 outputs an equal comparison signal C2 to the reset terminal of the PWM output circuit 109. At the trailing edge of the equal comparison signal C2, the PWM output circuit 109 causes the PWM output to go low. Thereafter, when the counted value of the timer 101 reaches the cycle set value Cb stored in the cycle set value register 103, the comparator 102 outputs an equal comparison signal C1 to the timer 101, the transfer controller 108, and the PWM output circuit 109. At the trailing edge of the equal comparison signal C1, the timer 101 is reset to zero and then is started counting again and the PWM output of the PWM output circuit 109 goes high.

Here, it is assumed that the write operation #3 is performed within the second cycle and the write operation #4 is performed after the second cycle. In other words, the CPU 12 performs the write operation #3 before the counted value TMR of the timer 101 reaches the cycle set value Cb and performs the write operation 190 4 after the counted value TMR of the timer 101 reaches the cycle set value Cb. Therefore, the next cycle set value Cc is written into the next-cycle set value register 104 when the write operation #3 is performed. However, the contents of the next-duty set value register 107 are preserved. That is, the next duty set value Db is stored therein.

In such a case, the write history flag in the transfer controller 108 is set when the write operation #3 is performed and the set status of the write history flag is kept until the write operation #4 is performed. As described before, in the case of the write history flag being in set status, the transfer controller 108 does not output the transfer permit signal even when the equal comparison signal C1 is received from the comparator 102. Therefore, the contents of the cycle set value register 103 and the duty set value register 106 are not changed. In other words, the cycle and duty of the third cycle is the same as those of the second cycle as shown in FIG. 2.

In the third cycle, the next duty set value is written into the next-duty set value register 107 by the write signal W2 (write operation #4). When the counted value of the timer 101 reaches the cycle set value Cb stored in the cycle set value register 103, the comparator 102 outputs an equal comparison signal C1 to the timer 101, the transfer controller 108, and the PWM output circuit 109. At the trailing edge of the equal comparison signal C1, the timer 101 is reset to zero and then is started counting again and the PWM output of the PWM output circuit 109 goes high. At the same time, the transfer controller 108 outputs the transfer permit signal because the write history signal has been reset. Therefore, the next cycle set value Cc is transferred from the next-cycle set value register 104 to the cycle set value register 103 and the next duty set value Dc is transferred from the next-duty set value register 107 to the duty set value register 106. In this way, the fourth cycle is started.

As described above, the write history flag that is set by the write signal W1 and is thereafter reset by the write signal W2 prevents undesired cycle and duty of PWM output even when timing relationship among the write signals W1, W2 and the equal comparison signal C1 is varied. In FIG. 2, the cycle and duty of the second cycle are repeated in the third cycle.

As shown in the third cycle of FIG. 2, the write history flag indicating the reset status is not changed when only the write signal W2 is received. This allows only the duty of PWM output to be changed by writing a next duty set value into the next-duty set value register 107. In other words, the cycle and duty of the PWM output can be arbitrarily designed by changing the cycle and duty set values and the output timing of the write signals W1 and W2.

As described before, the transfer controller 108 operates such that the transfer permit signal is output when the operation permit signal is reset or when the equal comparison signal C1 is output in the case where the write history flag is reset. Another embodiment is shown in FIG. 3.

Figure 3:
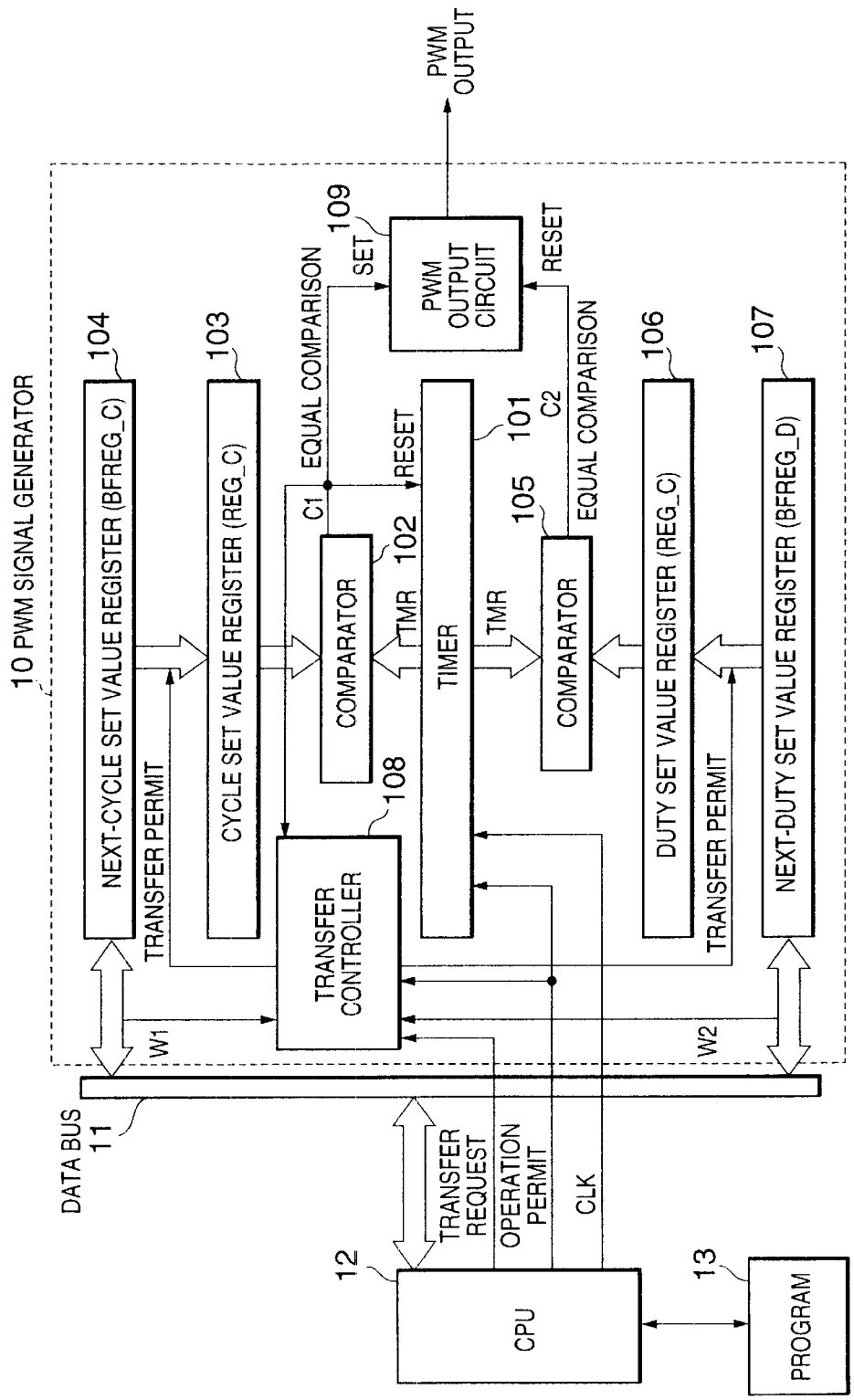
FIG. 3 is a block diagram showing a PWM signal generator according to another embodiment of the present invention.

Referring to FIG. 3, the CPU 12 may output a transfer request signal to the transfer controller 108 in arbitrary timing. The transfer controller 108 is designed such that the transfer permit signal is output in response to the transfer request signal from the CPU 12. Therefore, the transfer permit signal can be output even if the write history signal is set. Under control of the CPU 12, a desired cycle and duty of PWM output can be obtained. The other configuration and operations are the same as in FIG. 1 and therefore the descriptions are omitted.

According to the above embodiments of the present invention, the transfer controller 108 always monitors the presence and absence of write operation of next-cycle and duty set values and controls the transfer of the next-cycle and duty set values to the cycle and duty registers 103 an 106. Therefore, the CPU is allowed to reliably set desired cycle and duty of PWM output without monitoring the timer, resulting in reduced burden on the CPU.

Figure 4:
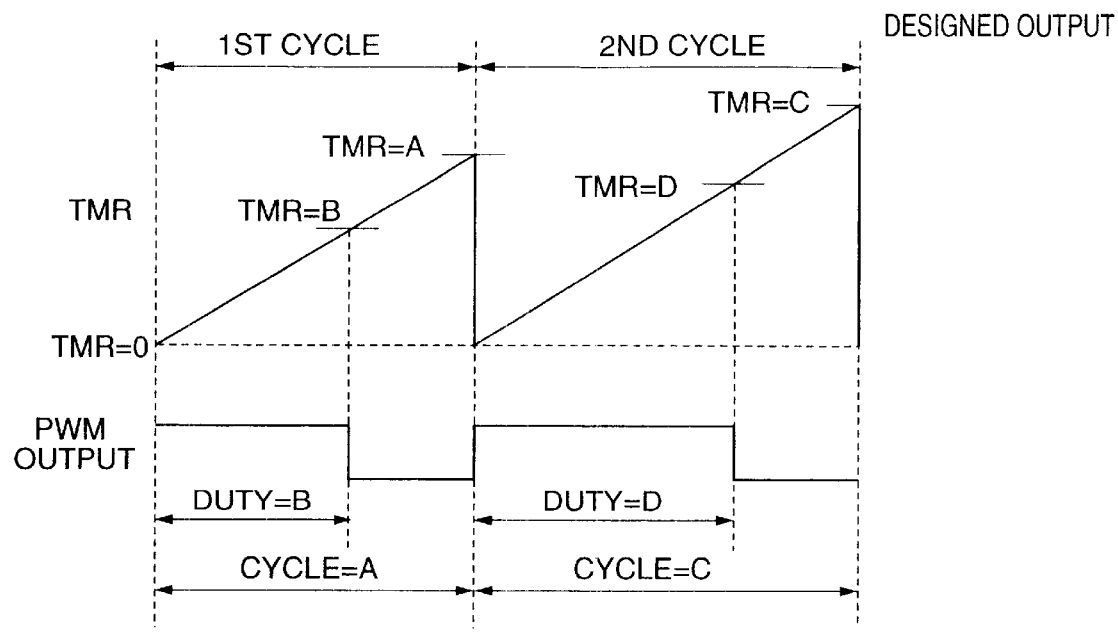
FIG. 4 is a diagram showing a designed PWM signal.
Figure 5:
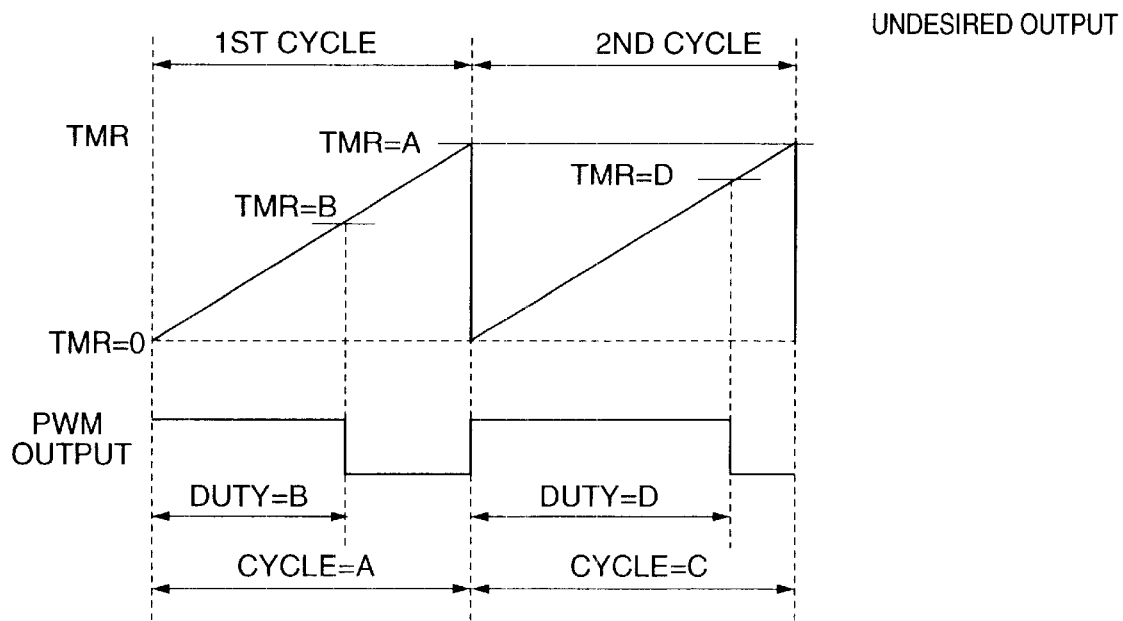
FIG. 5 is a diagram showing an undesired PWM signal, which is not output according to the present invention.

In the case where a PWM signal is designed such that Cycle=A and Duty=B for a first cycle and Cycle=C and Duty=D for a second cycle as shown in FIG. 4, the PWM signal generator 10 prevents output of an undesired PWM signal such as Cycle=A and Duty=B for the first cycle and Cycle=A and Duty=D for the second cycle as shown in FIG. 5. In other words, the write history flag that is set by the write signal W1 and is thereafter reset by the write signal W2 prevents such undesired cycle and duty of PWM output.

Since the write history flag indicating the reset status is not changed when only the write signal W2 is received, only the duty of PWM output can be changed by writing a next duty set value into the next-duty set value register 107. In other words, the designed cycle and duty of PWM output can be output by setting the cycle and duty set values and the output timing of the write signals W1 and W2.

The present invention is applicable to control of an inverter that is used for motor control in air conditioner, electric car, and the like. Especially, the PWM signal generator according to the present invention is suitable for one-chip microcomputer provided in an air conditioner or the like to control the rotation speed of a motor in real time.

What is claimed is:

1. An apparatus for generating a pulse width modulation (PWM) signal depending on a sequence of combinations of cycle set value and duty set value which are received from a controller, comprising:
   a first cycle setting memory for storing the cycle set value which is written according to a cycle write control signal;
   a second cycle setting memory for storing a current cycle set value which is transferred from the first cycle setting memory according to a transfer permit signal;
   a first duty setting memory for storing the duty set value which is written according to a duty write control signal;
   a second duty setting memory for storing a current duty set value which is transferred from the first duty setting memory according to the transfer permit signal;
   a timer for counting according to a predetermined clock signal to produce a counted value;
   a cycle comparator for comparing the counted value to the current cycle set value to produce a cycle coincidence signal when the counted value reaches the current cycle set value, wherein the cycle coincidence signal causes the timer to be reset to zero;
   a duty comparator for comparing the counted value to the current duty set value to produce a duty coincidence signal when the counted value reaches the current duty set value; and
   an output section for setting the PWM signal when the cycle coincidence signal is produced and resetting the PWM signal when the duty coincidence signal is produced.

2. The apparatus according to claim 1, wherein, when at least one cycle and duty of the PWM signal is changed in a following cycle, at least corresponding one of the cycle write control signal and the duty write control signal is received from the controller until the cycle coincidence signal is produced.

3. The apparatus according to claim 1, further comprising:
   a transfer controller for producing the transfer permit signal based on the cycle coincidence signal, the cycle write control signal, the duty write control signal, and an operation status of the timer.

4. The apparatus according to claim 3, wherein the transfer controller produces the transfer permit signal when the cycle coincidence signal is produced in an interval after the duty write control signal has been produced and before the cycle write control signal is produced.

5. The apparatus according to claim 3, wherein the transfer controller sets a write history flag when the cycle write control signal is produced and resets the write history flag when the duty write control signal is produced, wherein the transfer permit signal is produced when the cycle coincidence signal is produced and the write history flag is in reset status, and the transfer permit signal is not produced when the cycle coincidence signal is produced and the write history flag is in set status.

6. The apparatus according to claim 1, further comprising:
   a transfer controller for producing the transfer permit signal when a transfer request signal is received from the controller.

7. A method for generating a pulse width modulation (PWM) signal depending on a sequence of combinations of cycle set value and duty set value which are received from a controller, comprising the steps of:
   a) storing the cycle set value which is written according to a cycle write control signal, into a first cycle setting memory;
   b) storing a current cycle set value which is transferred from the first cycle setting memory according to a transfer permit signal, into a second cycle setting memory;
   c) storing the duty set value which is written according to a duty write control signal, into a first duty setting memory;
   d) storing a current duty set value which is transferred from the first duty setting memory according to the transfer permit signal, into a second duty setting memory;
   e) counting according to a predetermined clock signal to produce a counted value;
   f) comparing the counted value to the current cycle set value to produce a cycle coincidence signal when the counted value reaches the current cycle set value, wherein the cycle coincidence signal causes the counted value to be reset to zero;
   g) comparing the counted value to the current duty set value to produce a duty coincidence signal when the counted value reaches the current duty set value; and
   h) setting the PWM signal when the cycle coincidence signal is produced and resetting the PWM signal when the duty coincidence signal is produced.

8. The method of claim 7, wherein, in steps (a) and (c), at least one of the cycle write control signal and the duty write control signal is received from the controller until the cycle coincidence signal is produced.

9. The method according to claim 7, further comprising the step of:
   i) producing the transfer permit signal based on the cycle coincidence signal, the cycle write control signal, the duty write control signal, and an operation status of the timer.

10. The method according to claim 9, wherein, in the step (i), the transfer permit signal is produced when the cycle coincidence signal is produced in an interval after the duty write control signal has been produced and before the cycle write control signal is produced.

11. The method according to claim 9, wherein the step (i) comprises the steps of:
   setting a write history flag when the cycle write control signal is produced;
   resetting the write history flag when the duty write control signal is produced,
   wherein the transfer permit signal is produced when the cycle coincidence signal is produced and the write history flag is in reset status, and the transfer permit signal is not produced when the cycle coincidence signal is produced and the write history flag is in set status.

12. The method according to claim 7, further comprising the step of:
   producing the transfer permit signal when a transfer request signal is received from the controller.

* * * * *

UNITED STATES PATENT AND TRADEMARK OFFICE
CERTIFICATE OF CORRECTION

PATENT NO. : 6,421,382 B1
DATED : July 16, 2002
INVENTOR(S) : Kazuyoshi Hayakawa It is certified that error appears in the above-identified patent and that said Letters Patent is hereby corrected as shown below:

Column 5,
Line 38, delete "190 4" insert -- #4 --

Column 6,
Line 42, delete "an" insert -- and --

Signed and Sealed this

Twenty-sixth Day of November, 2002

*Attest:*

*Attesting Officer*

JAMES E. ROGAN
*Director of the United States Patent and Trademark Office*